(12) United States Patent
Lye et al.

(10) Patent No.: US 6,392,498 B1
(45) Date of Patent: May 21, 2002

(54) METHOD AND APPARATUS FOR A DIGITAL CLOCK MULTIPLICATION CIRCUIT

(75) Inventors: Kin Mun Lye; Jurianto Joe, both of Singapore (SG)

(73) Assignee: The National University of Singapore, Singapore (SG)

( * ) Notice: Subject to any disclaimer, the term of this patent is extended or adjusted under 35 U.S.C. 154(b) by 0 days.

(21) Appl. No.: 09/633,076

(22) Filed: Aug. 4, 2000

Related U.S. Application Data

(63) Continuation-in-part of application No. 09/558,082, filed on Apr. 25, 2000.

(51) Int. Cl.[7] .................................................. H03K 5/00
(52) U.S. Cl. .......................... 331/56; 331/53; 331/46; 331/49; 327/116; 327/119
(58) Field of Search ............................. 331/46, 47, 53, 331/49, 56, 115; 327/116, 119

(56) References Cited

U.S. PATENT DOCUMENTS

| | | | |
|---|---|---|---|
| 3,312,911 A | 4/1967 | De Boer | 331/49 |
| 3,967,210 A | 6/1976 | Aumann | 331/56 |
| 4,028,562 A | 6/1977 | Zuleeg | 327/566 |
| 4,365,212 A | 12/1982 | Gentile et al. | 331/111 |
| 5,107,264 A | 4/1992 | Novof | 341/101 |
| 5,339,053 A | 8/1994 | Lux et al. | 331/99 |

FOREIGN PATENT DOCUMENTS

| | | |
|---|---|---|
| FR | 1 438 262 A | 7/1966 |
| JP | 11074766 | 3/1999 |

OTHER PUBLICATIONS

Peter Konig, *Image Segmentation Based on Oscillatory Correlation*, Neural Computation 9, 1997, pps. 805–836.
James P. Keener, *Analog Circuitry for the van der Pol and FitzHugh—Nagumo Equations*, IEEE 1983, pps. 1011–1015.
Abel, E., "Gated Oscillator Emulates a Flip–Flop", EDN Access, pps. 1–2, Mar. 16, 1995.
Gallerani, A., "Oscillator Meets Three Requirements", EDN Access, pps. 119–120, Dec. 3, 1998.

*Primary Examiner*—Arnold Kinkead
(74) *Attorney, Agent, or Firm*—Townsend and Townsend and Crew LLP; Kenneth R. Allen

(57) ABSTRACT

A clock multiplication technique includes driving two oscillatory circuits by an input signal. One of the circuits has an inverted input. The oscillatory circuits are characterized by a transfer function having an unstable region bounded by two stable region. Oscillations produced during operation of each of the circuits in the unstable regions are combined to produce a signal whose frequency is a multiple of the input frequency.

28 Claims, 6 Drawing Sheets

METHOD AND APPARATUS FOR A DIGITAL CLOCK MULTIPLICATION CIRCUIT

CROSS REFERENCE TO RELATED APPLICATIONS

This application is a continuation-in-part of U.S. Application Ser. No. 09/558,082, filed Apr. 25, 2000, and is herein incorporated by reference for all purposes.

BACKGROUND OF THE INVENTION

The present invention relates to digital circuits and more particularly to clock multiplication circuitry.

A clock multiplication circuit outputs a clock frequency that is a result of an integer multiplication of the input clock frequency. Frequency multiplication has many uses. For example, frequency multiplication allows a microprocessor to carry out instruction execution at different clock rates.

In a conventional clock multiplication circuit, a phase locked loop is used. A phase locked loop typically comprises a phase detection circuit, an amplifier, and a voltage-controlled oscillatory. There has traditionally been reluctance to use phase locked loops, partly because of the complexity of using discrete components to realize such circuits.

Another method to realize a clock multiplication circuit is shown in U.S. Pat. No. 5,107,264. As can be seen in FIG. 2 of the patent, this circuit requires the use of Q-1 delay circuits to achieve an output whose frequency is a Q multiple of the input clock frequency. A total of Q-1 delayed versions of the low frequency input clock are passed through an edge detector (36) which responds to the rising edge of a pulse by producing one high frequency pulse. Since there are Q numbers of low frequency clock with different delay passing through the edge detectors, then Q numbers of high frequency pulse are generated at different times. All these high frequency pulses are combined by an OR gate (40) to yield Q clock pulses in response to one low frequency clock at the input.

The number of delay circuits and edge detectors increases as the multiplication factor is increased. Furthermore, when the multiplication factor for the same input clock frequency is changed, besides having to add/remove the delay circuits and edge detectors, the parameters of each delay circuit have to be re-tuned. This process is impractical when Q is large.

There is a need for an improved digital clock multiplication technique.

SUMMARY OF THE INVENTION

A method for frequency multiplication includes producing a first intermediate signal having n/2 oscillations during the first half of one cycle of the input signal and no oscillations during the second half of the cycle. A second signal having no oscillations during the first half cycle and n/2 oscillations during the second half cycle is combined with the first signal to produce the multiplied signal.

In accordance with the invention, the first and second signal are produced by a circuit that is defined by a transfer function characterized by having an unstable operating region bounded by a first stable operating region and a second stable operating region. The circuit produces oscillatory output when its operating point is moved into the unstable region. The circuit produces a non-oscillatory output when its operating point is placed into either of the first and second stable regions. The method further includes forcing the operating point into the unstable region to produce oscillatory output. The method further includes forcing the operating point into one of the stable regions in order to terminate oscillations.

The inventive circuit is advantageous in that its oscillations start and stop substantially instantaneously. There are no transients between the ON and OFF state of the oscillator. Another advantage is that the period of the first cycle of oscillation during an ON period is the same as the subsequent cycles in that ON period. There is no need for additional supporting circuit elements or special circuits for maintaining standby levels in the capacitor. The circuit does not require any external free running oscillation. The circuit will generate its own oscillation when triggered by the enable signal. The circuit is inherently synchronized with the enable signal. By tuning the circuit parameter, without changing the circuit configuration, the duty cycle and the frequency of oscillation can be varied. The gated oscillation at the output of the circuit is not overlapping with the enable signal and therefore no additional circuit is required to separate them.

BRIEF DESCRIPTION OF THE DRAWINGS

The teachings of the present invention can be readily understood by considering the following detailed description in conjunction with the accompanying drawings.

DESCRIPTION OF THE SPECIFIC EMBODIMENTS

Figure 1A:
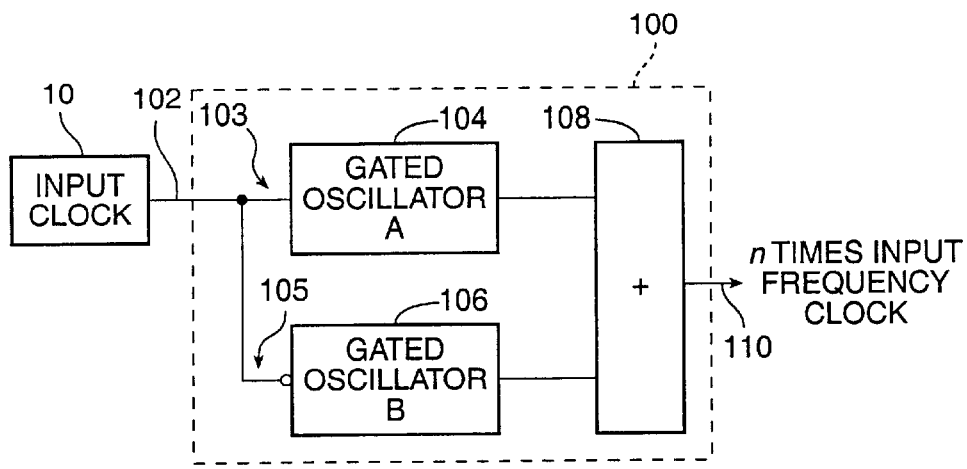
FIG. 1A shows a circuit arrangement of a typical embodiment of the clock multiplication technique of the present invention.
Figure 1B:
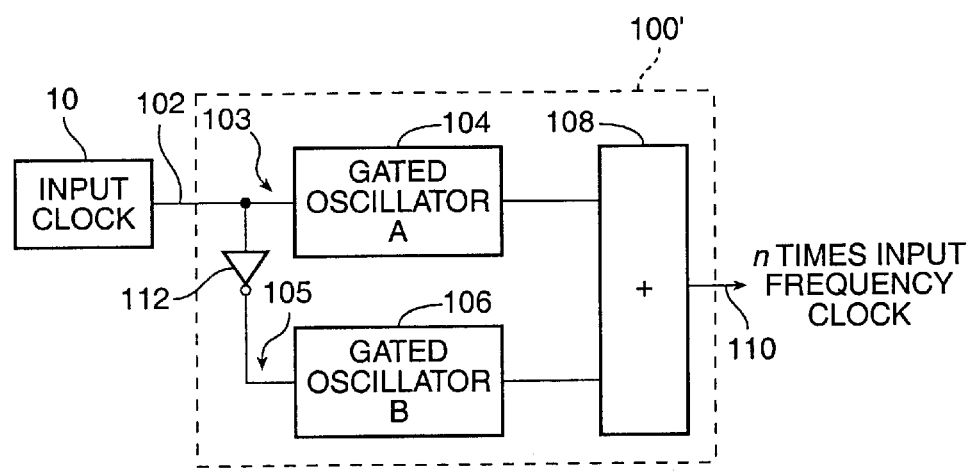
FIG. 1B shows an alternate circuit arrangement of a typical embodiment of the clock multiplication technique of the present invention.

Referring to FIGS. 1A and 1B, schematic block diagrams illustrate an embodiment of a clock multiplication circuit 100 in accordance with the present invention includes an input terminal 102 for receiving a clock input signal of a first frequency. A conventional clock source 10 is shown providing the clock input signal. An output terminal 110 delivers an output signal of a second frequency that is higher than the first frequency.

Input terminal 102 feeds the clock input signal to a pair of gated oscillator circuits 104, 106. Gated oscillator circuit 104 receives a non-inverted signal from input terminal 102. Gated oscillator circuit 106 includes an inverter circuit to invert the signal received at input terminal 102. As can be seen in FIG. 1B, input signal inversion for gated oscillator 106 can be provided by an inverter 112.

As will be discussed below, the gated oscillators are enabled by the input signal. Gated oscillator 104 is enabled when the input signal level is HIGH. Conversely, because of its inverter circuit, gated oscillator 106 is enabled when the input signal level goes LOW. The gated oscillators both produce sequences of pulses.

Assuming that the desired frequency multiplication factor is n, gated oscillator 104 is adjusted to produce n/2 oscillations per half cycle of the input signal. In other words, during the time that the input signal is HIGH, gated oscillator 104 produces n/2 pulses. Similarly, during the LOW cycle of the input signal, gated oscillator 106 produces n/2 pulses.

The output of each of the two gated oscillators feeds into a combining circuit 108. In one embodiment, combining circuit 108 comprises a two-input OR gate. In this embodiment, each output feeds into an input of the OR gate. In an alternate embodiment, the combining circuit is a conventional analog summing circuit. Here, the output of each gated oscillator 104, 106 feeds into an input of the summer.

The oscillations produced by the gated oscillators are combined by combining circuit 108 to produce an output having a frequency that is n times the input frequency. Thus, during the first half-period of the input signal, output 110 of clock multiplication circuit 100 comprises the n/2 oscillations from gated oscillator 104, the output of gated oscillator 106 being LOW during this period of time. During the second half-period of the input signal, output 110 comprises the n/2 oscillations from gated oscillator 106, the output of gated oscillator 104 being LOW during this period of time. The result is multiplication of the input clock frequency by a factor of n.

It is noted that in general, the multiplication factor can be readily changed to realize any multiplication factor (m+n). As will become clear, gated oscillators 104 and 106 can be tuned differently such that gated oscillator 104 produces n oscillations when it is enabled and gated oscillator 106 produces a oscillations when it is enabled. When the input clock signal at terminal 102 is HIGH, gated oscillator 104 will produce m oscillations, while no oscillations come out of gated oscillator 106. When input clock signal is LOW, gated oscillator 106 will produce n oscillations, while no oscillations come out of gated oscillator 104. When the outputs of gated oscillators 104 and 106 are combined (summed) together using an analog summing circuit (or an OR gate) 108, the output 110 will contain (m+n) clock pulses which is (m+n) times the input clock frequency. In addition, this simple circuit allows not only even but also odd multiplication factors to be realized by appropriate selections of m and n.

Figure 1C:
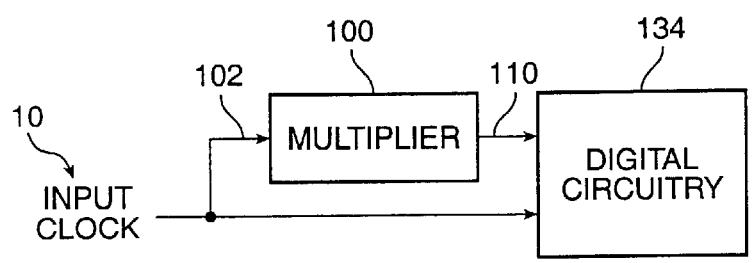
FIG. 1C shows a typical use of a circuit arrangement in accordance with a typical embodiment of the clock multiplication technique of the present invention.

FIG. 1C shows a typical use of multiplication circuit 100 in a digital system. Here, a clock signal at clock input terminal 102 having a first frequency is delivered to digital circuitry 134. The clock input also feeds into multiplier 100 to produce a second clock input 110 having a second frequency, which also feeds into digital circuitry 134.

Figure 2:
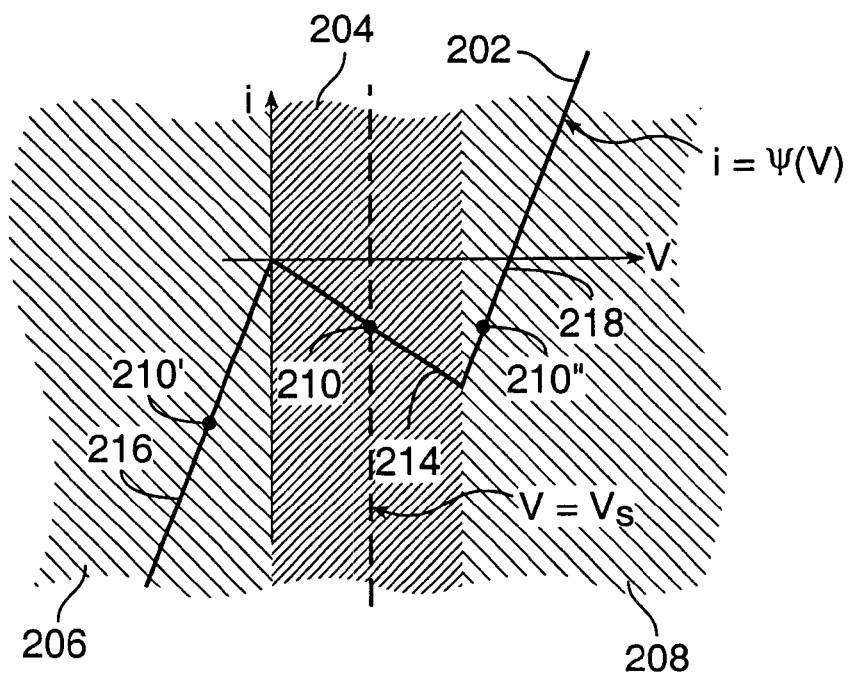
FIG. 2 illustrates generally the transfer function of a circuit used in the gated oscillator of FIG. 1.

Referring to FIG. 2, the gated oscillator circuits in accordance with the present invention exhibit a transfer function whose curve has a generally N-shaped appearance. For the purposes of the present invention, the "transfer function" of a circuit refers to the relationship between any two state variables of that circuit. For example, electronic circuits are typically characterized by their I–V curves, the two state variables being current (I) and voltage (V). Such curves indicate how one state variable (e.g., current, I) changes as the other state variable (voltage, V) varies. As can be seen in FIG. 2, a transfer function curve 202 includes a portion which lies within a region 204, referred to herein as an "unstable" region. The unstable region is bounded on either side by regions 206 and 208, each of which is herein referred to as the "stable" region. As can be seen in FIG. 2, portions of the transfer function curve 202 also lie in the stable regions.

A circuit in accordance with the invention has an associated "operating point" which is defined as its location on the transfer function 202. FIG. 2 shows three operating point positions, 210, 210', and 210". The nature of the output of the circuit depends on the location of the operating point along the transfer function. If the operating point is positioned along the portion 214 of the transfer function that lies within region 204, the output of the circuit will exhibit an oscillatory behavior. Hence, the region 204 in which this portion of the transfer function is found is referred to as an unstable region. If the operating point is positioned along the portions 216, 218 of the transfer function that lie within either of regions 206 and 208, the output of the circuit will exhibit a generally time-varying but otherwise non-oscillatory behavior. For this reason, regions 206 and 208 are referred to as stable regions.

Figure 3:
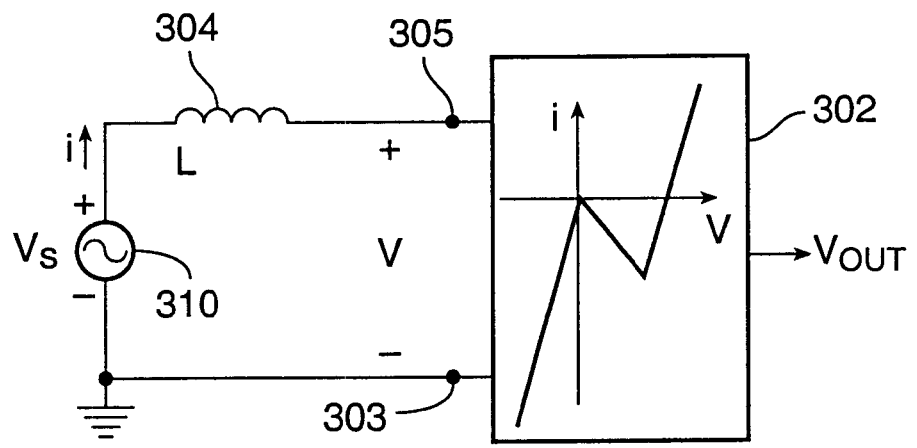
FIG. 3 illustrates schematically a circuit arrangement for forcing the operating point between stable and unstable regions.

Referring to FIGS. 2 and 3, a general configuration for varying the operating point of a circuit is shown. The figure shows a circuit 302 having an input defined by terminals 303 and 305. An inductive element 304 is coupled to terminal 305. A function generator 310 is coupled between the other end of inductive element 304 and terminal 303 of circuit 302, thus completing the circuit. In accordance with the invention, circuit 302 has a transfer function which appears N-shaped. Further in accordance with the invention, circuit 302 is characterized in that its operating point can moved into and out of the unstable region 204 depending on the level of the output $V_s$ of function generator 310. This action controls the onset of oscillatory behavior, and cessation of such oscillatory behavior, at the output $V_{out}$ of circuit 302. Forcing the operation point to be on a portion of the transfer function that lies in the unstable region 204 will result in oscillatory behavior. Forcing the operating point to lie on the transfer function found in one of the stable regions 206, 208 will result in non-oscillatory behavior.

Figure 4:
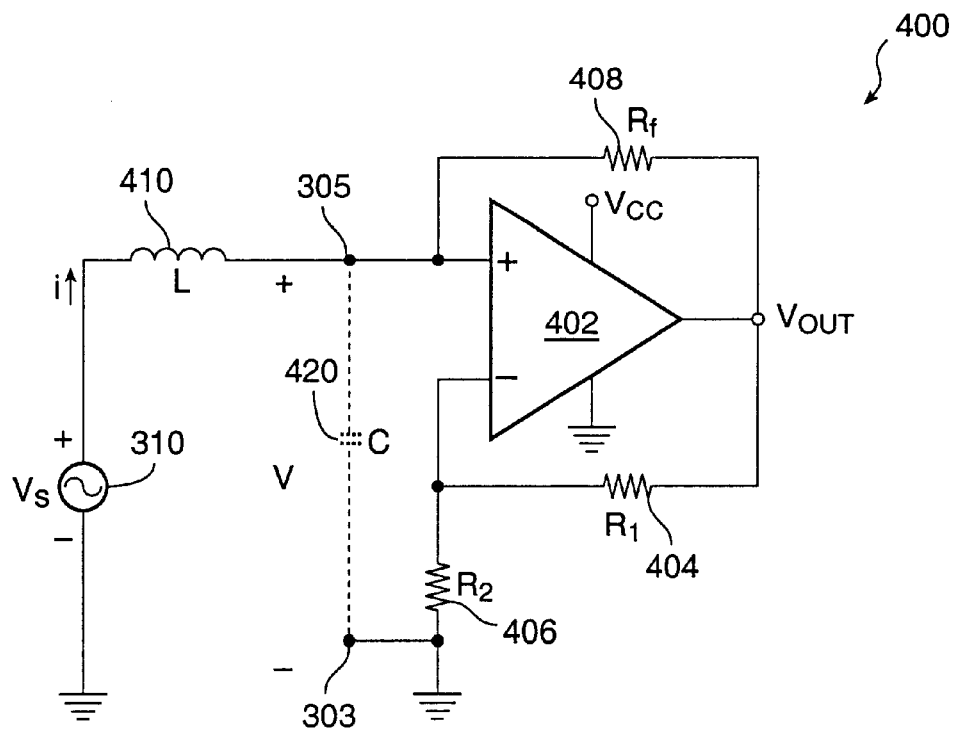
FIG. 4 is an example of a circuit configuration in accordance with the invention.

An example of a circuit that exhibits the N-shaped transfer function is an operation amplifier (op-amp) configured with a feedback resistor between the op-amp output and its non-inverting input. FIG. 4 shows such a circuit 400. An op-amp 402 includes a positive feedback path wherein the op-amp's output $V_{out}$ feeds back to its non-inverting input via feedback resistor 408 having a resistance $R_f$. A portion of the output voltage of op-amp 402 is provided to its inverting input. FIG. 4 shows a voltage dividing circuit comprising resistors 404 and 406, having respectively resistances $R_1$ and $R_2$, to supply a portion of the op-amp output back to its inverting input. Completing the circuit is an inductor 410 and function generator 310 coupled in series between the non-inverting input of op-amp 402 and ground. A typical off-the-shelf op-amp can be used, such as the commonly available LM-358 op-amp.

Figure 5:
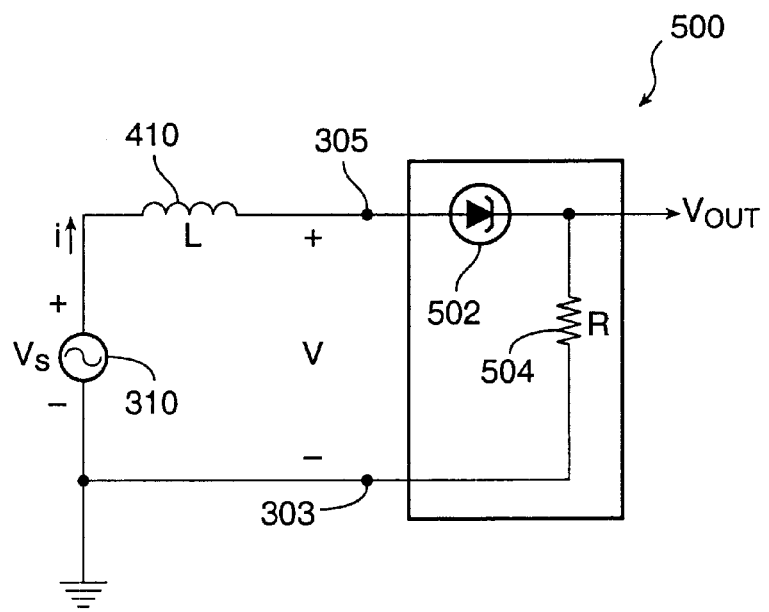
FIG. 5 is another example of a circuit configuration in accordance with the invention.

Another example of a circuit having an N-shaped transfer function is shown in FIG. 5. Here, circuit 500 comprises a tunnel diode 502 coupled to function generator 310 through inductive element 410. The output $V_{out}$ is taken across resistor 504, which is coupled between the other end of diode 502 and ground.

The foregoing circuits can be expressed by the following generalized pair of coupled equations which describe a two-variable Van der Pol (VdP) oscillator:

$$L\frac{dy}{dt} = f(t) - x \quad (1)$$

$$\varepsilon \frac{dx}{dt} = y - \Psi(x) \quad (2)$$

where x and y are the state variables of the VdP oscillator,
L and $\varepsilon$ are parameters of the VdP oscillator,
f(t) is a time varying forcing function that is controllable and can be used to move the operating point of the VdP oscillator, and
$\psi(x)$ is a cubic function of variable x. $\psi(x)$ is the key for establishing a controllable VdP oscillator.

Equations (1) and (2) relate to the circuit of FIG. 4 by replacing variables x and y respectively with V and i to represent physical variables that are commonly used in a circuit design. Hence, $$L\frac{di}{dt} = V_s - V \quad (3)$$

$$\lim_{C \to 0} C\frac{dV}{dt} = i - \Psi(V) \quad (4)$$

Parameter C in Eq. (4) represents a small parasitic capacitor 420 across the voltage V, shown in FIG. 4 by phantom lines. $V_s$ is the time varying voltage source of function generator 310 which acts as forcing function. The operating point of circuit 400 is obtained by setting $$\frac{dV}{dt} = 0$$

and $$\frac{di}{dt} = 0.$$

Equations (3) and (4) become $V=V_s$ and $i=\psi(V)$, respectively, $i=\psi(V)$ is the transfer function of the op amp with $R_f$, $R_1$ and $R_2$ combinations. Thus, with reference back to FIG. 2, it can be seen that transfer function curve 202 is defined by $i=\psi(V)$.

The intersection between the line $V=V_s$ and the curve $i=\psi(V)$ defines the operating point 210 of the circuit. A closer inspection of transfer function 202 defined by $i=\psi(V)$ reveals that segments 216,218 have positive slope (di/dV>0) and segment 214 has a negative slope (di/dV<0). When op-amp 402 (FIG. 4) is saturated, operating point 210 lies along one of the two positive sloped segments 216, 218. When op-amp 402 is operating linearly, the operating point lies along the negative sloped segment. When the operating point is on the negative sloped segment 214, oscillatory behavior will be observed at the output $V_{out}$ of circuit 400. Hence the negative sloped segment is said to lie in unstable region 204 as is operating point 210. When the operating point 210', 210" is on a positive sloped segment, a non-oscillatory output is observed. Hence the positive segments are said to lie in stable regions 206, 208.

The operating point 210 can be moved along the transfer function by changing the output $V_s$ of function generator 310 as it is applied to the input of circuit 400. In particular, the operating point can be moved into unstable region 204 when an enable signal is provided by the function generator. Conversely, the operating point can be moved out of the unstable region and into one of the stable regions 206,208 by the application of a disable signal. The resulting behavior of circuit 400 is that of a gated oscillator.

Figure 6:
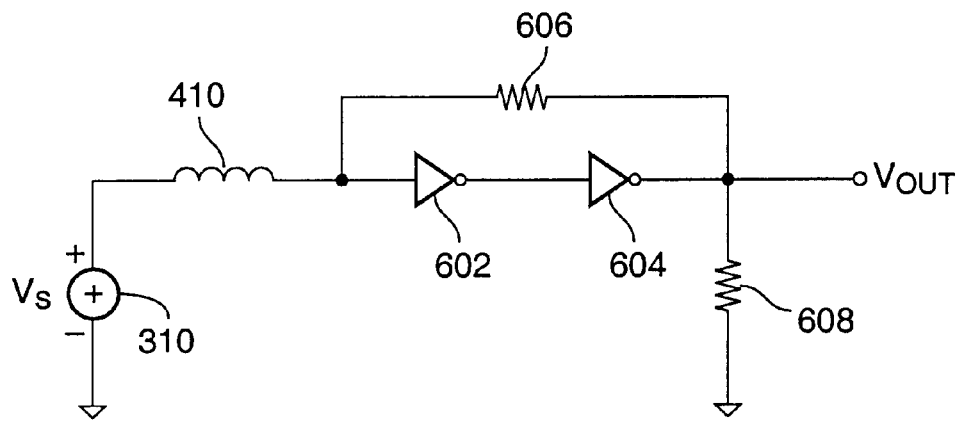
FIG. 6 is yet another example of a circuit configuration in accordance with the invention.

FIG. 6 shows yet another embodiment of the gated oscillator of the invention. As in the foregoing figures, a function generator 310 provide a variable voltage signal $V_s$. This signal feeds through inductor 410 into a first inverter 602. The output of inverter 602 is coupled to a second inverter 604. The output of inverter 604 is taken across resistor 608 to provide output $V_{out}$. A feedback path from the output of inverter 604 to the input of inverter 602 is provided via resistor 606.

The gated oscillator circuits 104, 106 (also, oscillation circuits) of FIGS. 1A and 1B preferably have the same design. The reason being a practical matter in that manufacture of such devices is simplified. However, it is within the scope of the invention that each gated oscillator circuit 104, 106 can have a design different from the other and still function in accordance with the invention.

Figure 7:
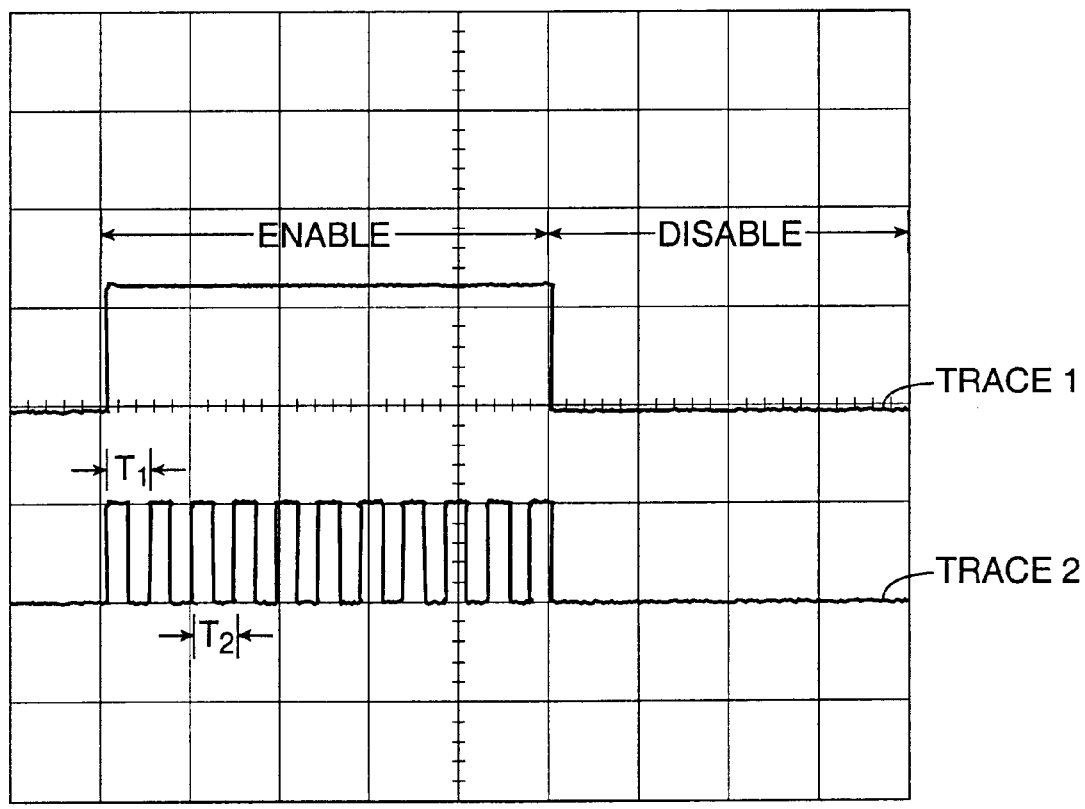
FIG. 7 illustrates measurements taken from a circuit constructed in accordance with the invention.

Referring now to FIG. 7, an oscilloscope trace is shown, illustrating the foregoing described behavior. Trace 1 is the output $V_s$ of function generator 310 as applied to the input of circuit 400. A first portion of the trace constitutes the ENABLE signal. This is followed by a second portion which constitutes the DISABLE signal. Preferably, the function generator output is a digital waveform. For example, a typical digital waveform is a square wave such as shown in FIG. 7. It is noted that typically, the digital waveform will be asymmetric along the time axis, since the periods of ON time and OFF time will depend on the nature of the particular application of the gated oscillator.

Trace 2 is the output voltage $V_{out}$ of circuit 400. As can be seen, the circuit begins to oscillate when an enable signal is received. The oscillations continue for the duration of the enable signal. It can be further seen that the first period $T_1$ of the first cycle has the same duration as each of the remaining cycles, $T_2$. The pulse width can be varied by changing the circuit parameters $R_f$, $R_1$, and $R_2$ or the op-amp DC bias $V_{CC}$. When the disable signal is received, the circuit stops oscillating instantaneously.

As an additional observation, the location of the operating point along the transfer curve in the unstable region can also affect the period of oscillations of the output of circuit 400. The location of the operating point within the unstable region (and the stable regions for that matter) can be determined by adjusting the level of the forcing function. It can be seen, therefore, that different oscillation periods can be attained from circuit 400 by applying an enable signal of different levels. The gated oscillator in accordance with the present invention can thus be made to produce different pulse widths by the use of a function generator in which the level of the enable signal can be controlled.

Since the forcing function in the present invention is a clock input (10, FIG. 1A), the levels of the forcing function will either be the LOW signal level or the HIGH signal level; the level of the LOW signal will not vary, the level of the HIGH signal will not vary. The oscillation period (and hence the multiplication factor) of each gated oscillator will be determined by adjusting its circuit parameters. As such, it can be seen that the multiplication circuit and technique of the present invention is advantageous in that its multiplication factor is quite easily changed. For example, the circuit of FIG. 4 permits period changes simply by adjusting the various resistive parameters.

However, it is noted that by appropriately attenuating or amplifying the clock signal level, the oscillation period will change. The method by which the oscillation period is varied will be dictated largely by the particular application.

Figure 8A:
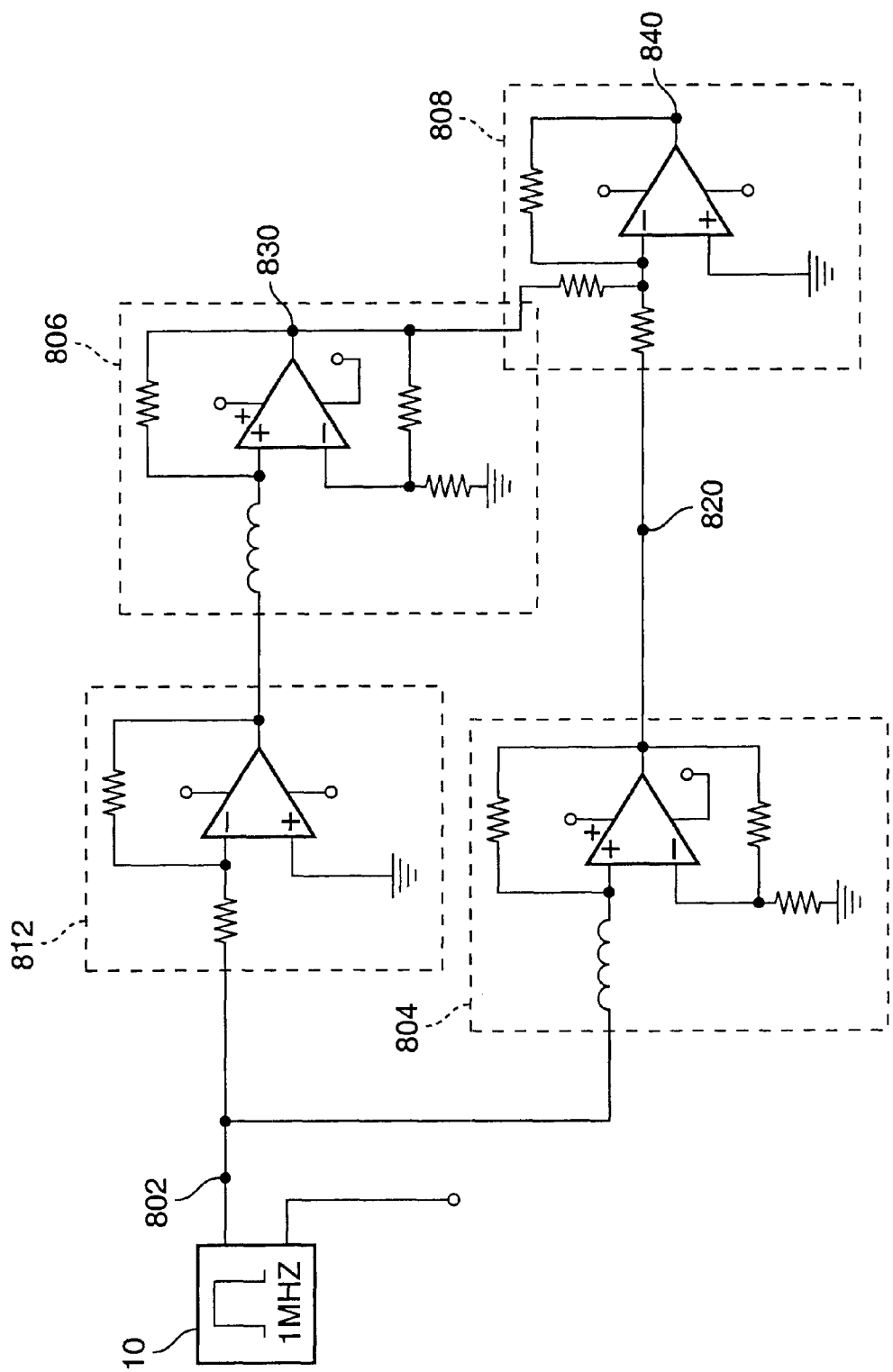
FIGS. 8A illustrates operation of the present invention.
Figure 8B:
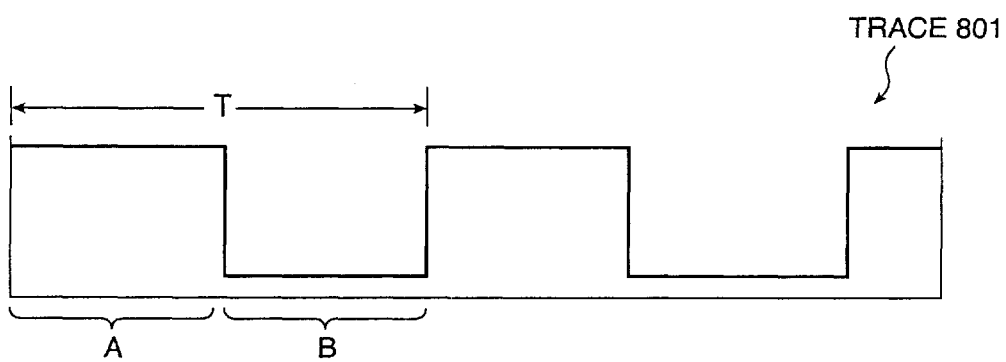
FIGS. 8B also illustrates operation of the present invention.
Figure 8B:
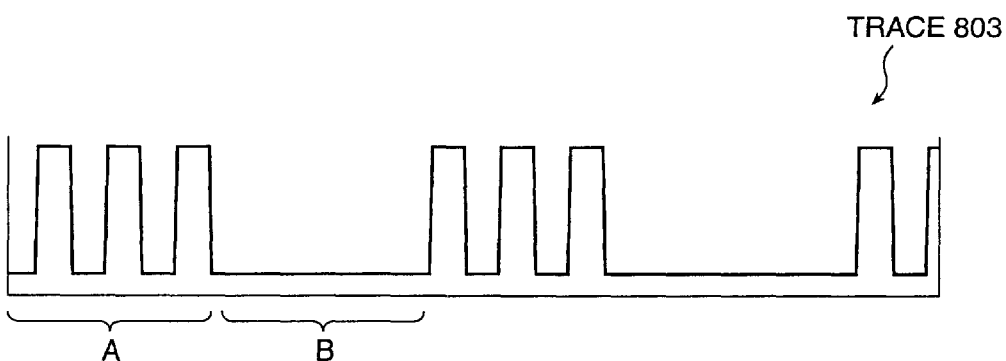
Figure 8B:
Figure 8B:
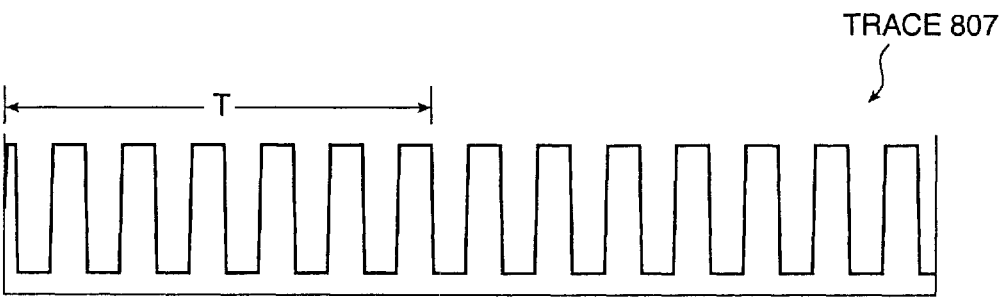

Referring now to FIGS. 8A and 8B, operation of the clock multiplication technique will now be discussed. FIG. 8A depicts circuit diagrams of each block shown in FIG. 1B. The inverter 812 and combining circuit 808 are realized using conventional op-amp circuit configurations. Combining circuit 808 is shown as an analog summing circuit. Gated oscillators 804, 806 can be realized using any combination of the circuits shown in FIGS. 4–6. In this case, the circuit from FIG. 4 is used for both oscillators.

The clock input signal 802 from input clock 10 is shown in Trace 801 of FIG. 8B. Each clock cycle has a period T, and comprises a first half-period portion A and a second half-period portion B. The clock input feeds into gated oscillator 804. During clock portion A, when the clock is HIGH, gated oscillator 804 produces a sequence of oscillations at its output 820. In this case, the parameters of the circuit of gated oscillator 804 are adjusted to produce three oscillations. During clock portion B, when the clock is LOW, there will be no oscillations. This output behavior of gated oscillator 804 can be seen in Trace 803.

In accordance with the invention, clock input signal 802 is fed into inverter 812 whose output is delivered to gated oscillator 806. During clock portion A, when the clock is HIGH, the inverter output will be LOW, and there will be no oscillations at the output 830 of gated oscillator 806. Conversely, during clock portion B, when the clock is LOW, the inverter output will be HIGH, and there will be oscillations at the output of gated oscillator 806. As with gated oscillator 804, the parameters of the circuit of gated oscillator 806 are adjusted to produce three oscillations. The output behavior of gated oscillator 806 can be seen in Trace 805.

Finally, output 820 and output 830 are combined by inverted summing circuit to give output 840 which is shown in Trace 807. To produce a non-inverted signal, an inverter circuit can be added after combining circuit 808. In this example, the input clock frequency has been multiplied by a factor of six. It can be seen, however, that by appropriate adjustment of the parameters of either or both of the gated oscillators a different multiplication factor is readily achieved. Moreover, it is not necessary that both gated oscillators produce the same oscillations. For example, a multiplication factor of six could also be achieved by adjusting gated oscillator 804 to produce four oscillations per half-cycle and adjusting gated oscillator 806 to produce two oscillations per half-cycle.

The invention described herein uses an unconventional method of controlling the operating point of a VdP oscillator to provide a significantly simplified digital circuit design to provide frequency multiplication. The inventive circuit accommodates different multiplication factors without the need for the addition/removal of components. A different multiplication factor can be obtained by tuning the components (e.g., $R_f$, $R_1$ and $R_2$ of the gated oscillator) or op-amp DC bias or applying different level of enable signal by modifying the level of the clock signal.

The invention requires only that an enabling signal be provided to "force" the VdP oscillator to oscillate and a disabling signal to stop oscillations. These signals can be readily generated by any of a number of known circuit designs.

Another advantage is that the circuit generates its own oscillations when enabled by an enable signal. Consequently, this allows for significant reductions in power consumption in digital circuit applications. This is especially advantageous given the low power requirements of many of today's digital applications.

Yet another advantage, the circuit is inherently synchronized with the enable signal. By tuning the circuit parameter, without changing the circuit configuration, the duty cycle and the frequency of oscillation can be varied. The gated oscillation at the output of the circuit does not overlap with the enable signal and therefore no additional circuitry is required to separate the signals, thus realizing a simplification in the gated oscillator circuitry.

What is claimed is:

1. A method for frequency multiplication of an input signal having a first signal level and a second signal level and a first frequency, comprising:

producing a first intermediate signal having m oscillations during the first half of a first cycle of said input signal and no oscillations during the second half of said first cycle, including feeding said input signal to an input of a first oscillation circuit;

producing a second intermediate signal having no oscillations during the first half of said first cycle and having n oscillations during a second half cycle of said first cycle, including inverting said input signal to produce an inverted signal and feeding said inverted signal to an input of a second oscillation circuit; and combining said first and second intermediate signals to produce an output signal having a second frequency that is a multiple of said first frequency, each said oscillation circuit having an operating point which varies depending on the level of the signal at its input, each said oscillation circuit further having a transfer function characterized by having an unstable operating region bounded by a first stable operating region and a second stable operating region so that each said oscillation circuit produces oscillatory output when said operating point is varied into said unstable region and each said oscillation circuit has a non-oscillatory output when said operating point is varied into either of said first and second stable regions.

2. The method of claim 1 wherein m is not equal to n.

3. The method of claim 1 wherein m is equal to n.

4. The method of claim 1 wherein m+n is an odd number.

5. The method according to claim 1 wherein:

said operating point of said first oscillation circuit is forced into said unstable region to produce at least one oscillation when said input signal is at said first signal level, and said operating point is forced to vary into either one of said stable operating regions in order to terminate said at least one oscillation when said input signal is at said second signal level; and said operating point of said second oscillation circuit is forced into said unstable region to produce at least one oscillation when said inverted signal is at said first signal level, and said operating point is forced to vary into either one of said stable operating regions in order to terminate said at least one oscillation when said inverted signal is at said second signal level.

6. The method of claim 1 wherein said combining includes feeding said first and second intermediate signals into inputs of a summing circuit.

7. The method of claim 1 wherein said combining includes feeding said first and second intermediate signals into inputs of an OR gate.

8. The method according to claim 1 wherein one of said oscillation circuits includes an operational amplifier circuit with feedback, said one of said oscillation circuits having a series input through an inductor, wherein said unstable operating region is a negative resistance region, and wherein said operating point is forced into said unstable region by a changing voltage applied to said inductor; and wherein the other of said oscillation circuits includes an element having negative impedance, said other oscillation circuit having a series input through an inductor, wherein said unstable operating region is a negative impedance region, and wherein said operating point is forced into said unstable region by a changing current applied through said inductor.

9. The method according to claim 8 wherein said element is a tunnel diode.

10. The method according to claim 1 wherein at least one of said oscillation circuits includes an operational amplifier circuit with feedback, said at least one of said oscillation circuits having a series input through an inductor, wherein said unstable operating region is a negative resistance region, and wherein said operating point is forced into said unstable region by a changing voltage applied to said inductor.

11. The method according to claim 1 wherein at least one of said oscillation circuits includes an element having negative impedance, said at least one of said oscillation circuits having a series input through an inductor, wherein said unstable operating region is a negative impedance region, and wherein said operating point is forced into said unstable region by a changing current applied through said inductor.

12. The method according to claim 11 wherein said element is a tunnel diode.

13. A frequency multiplication circuit comprising:

a signal input terminal for receiving an input signal having a first frequency, said input signal having a first signal level and a second signal level;

a first oscillation circuit having an input coupled to receive a signal from said signal input terminal, and further having an output;

an inverter circuit having an input coupled to receive a signal from said signal input terminal, and further having an output;

a second oscillation circuit having an input coupled to receive an inverted signal from said output of said inverter circuit, and further having an output; and a combining circuit having an input coupled to receive signals from said outputs of said oscillation circuits, said combining circuit further having a signal output terminal, each said oscillation circuit configured so that its transfer function has an unstable operating region bounded by a first stable operating region and by a second stable operating region, each said oscillation circuit having an operating point dependent on the signal level at said input of each said oscillation circuit, each said oscillation circuit further configured to produce oscillatory output when said operating point is varied into said unstable operating region, each said oscillation circuit further adapted to produce a non-oscillatory output when said operating point is varied into either of said first and second stable operating regions.

14. The frequency multiplication circuit according to claim 13 wherein said operating point of said first oscillation circuit is forced into said unstable operating region to produce at least one oscillation upon receiving a signal that is at said first signal level, and said operating point of said first oscillation circuit is forced to vary into either one of said first and second stable operating regions in order to terminate said at least one oscillation upon receiving a signal that is at said second signal level; and said operating point of said second oscillation circuit is forced into said unstable operating region to produce at least one oscillation upon receiving a signal that is at said first signal level, and said operating point of said second oscillation circuit is forced to vary into either one of said first and said second stable operating regions in order to terminate said at least one oscillation upon receiving a signal that is at said second signal level.

15. The frequency multiplication circuit according to claim 13 wherein said combining circuit is a summing circuit.

16. The frequency multiplication circuit according to claim 13 wherein said combining circuit is an OR gate.

17. The frequency multiplication circuit according to claim 13 wherein one of said first and said second oscillation circuits includes a first negative impedance element, wherein said unstable operating region is a first negative impedance region, and wherein said operating point of said one of said first and said second oscillation circuits is forced into said unstable operating region by the signal level of a received signal; and wherein the other of said first and said second oscillation circuits includes a second negative impedance element, said other of said first and said second oscillation circuits having a series input through an inductor, wherein said unstable operating region is a second negative impedance region, and wherein said operating point of said other of said first and said second oscillation circuits is forced into said unstable operating region by a changing current applied through said inductor.

18. The frequency multiplication circuit according to claim 17 wherein said second negative impedance element is a tunnel diode.

19. The frequency multiplication circuit according to claim 18 wherein said first and said second oscillation circuits each includes a negative impedance element, wherein said unstable operating region is a negative impedance region, and wherein said operating point of each of said first and said second oscillation circuits is forced into said unstable operating region by the signal level of a received signal.

20. The frequency multiplication circuit according to claim 18 wherein said oscillation circuits each includes a negative impedance element, said first and said second oscillation circuits each having a series input through an inductor, wherein said unstable operating region is a negative impedance region, and wherein said operating point of each of said first and said second oscillation circuits is forced into said unstable operating region by a changing current applied through said inductor.

21. The circuit according to claim 20 wherein said negative impedance element is a tunnel diode.

22. A digital system comprising:

first digital circuitry; and second digital circuitry operatively coupled to said first digital circuitry, said second digital circuitry including a digital clock multiplier, said digital clock multiplier comprising:

a clock input terminal for receiving a clock signal having a first frequency, said clock signal having a first signal level and a second signal level;

a first oscillation circuit having an input coupled to receive a signal from said clock input terminal, and further having an output;

an inverter circuit having an input coupled to receive a signal from said clock input terminal, and further having an output;

a second oscillation circuit having an input coupled to receive an inverted signal from said output of said inverter circuit, and further having an output; and a combining circuit having an input coupled to receive signals from said outputs of said oscillation circuits, said combining circuit further having a clock output terminal, each said oscillation circuit having an operating point and a transfer function, said transfer function having an unstable operating region bounded by a first stable operating region and by a second stable operating region, each said oscillation circuit adapted to produce oscillatory output when said operating point is varied into said unstable operating region, each said oscillation circuit further adapted to produce a non-oscillatory output when said operating point is varied into either of said first and second stable operating regions.

23. The system of claim 22 wherein said operating point of said first oscillation circuit is forced into said unstable operating region to produce at least one oscillation upon receiving a signal that is at said first signal level, and said operating point of said first oscillation circuit is forced to vary into either one of said first and second stable operating regions in order to terminate said at least one oscillation upon receiving a signal that is at said second signal level; and said operating point of said second oscillation circuit is forced into said unstable operating region to produce at least one oscillation upon receiving a signal that is at said first signal level, and said operating point of said second oscillation circuit is forced to vary into either one of said first and second stable operating regions in order to terminate said at least one oscillation upon receiving a signal that is at said second signal level.

24. The system of claim 22 wherein said combining circuit is an OR gate.

25. A method for frequency multiplication of an input signal by a factor of (m+n), comprising:

producing a first signal having m oscillations during the first half of a first cycle of said input signal and no oscillations during the second half of said first cycle;

producing a second signal having no oscillations during the first half of said first cycle and having n oscillations during a second half cycle of said first cycle; and combining said first and second signals to produce a third signal that has a frequency of (m+n) times the frequency of said input signal.

26. The method of claim 25 wherein m is not equal to n.

27. The method of claim 25 wherein m is equal to n.

28. The method of claim 25 wherein (m+n) is an odd number.

* * * * *